United States Patent
Oyaizu et al.

(10) Patent No.: US 11,864,316 B2
(45) Date of Patent: Jan. 2, 2024

(54) WIRING SUBSTRATE

(71) Applicant: Fujikura Ltd., Tokyo (JP)

(72) Inventors: Naoki Oyaizu, Sakura (JP); Yusuke Fujita, Sakura (JP); Toshiaki Inoue, Sakura (JP); Shinya Kashima, Akita (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 17/630,630

(22) PCT Filed: Jul. 16, 2021

(86) PCT No.: PCT/JP2021/026731
§ 371 (c)(1),
(2) Date: Jan. 27, 2022

(87) PCT Pub. No.: WO2022/107389
PCT Pub. Date: May 27, 2022

(65) Prior Publication Data
US 2022/0361330 A1 Nov. 10, 2022

(30) Foreign Application Priority Data
Nov. 18, 2020 (JP) .................... 2020-191768

(51) Int. Cl.
*H05K 1/11* (2006.01)

(52) U.S. Cl.
CPC ..... *H05K 1/113* (2013.01); *H05K 2201/0305* (2013.01); *H05K 2201/09481* (2013.01);
(Continued)

(58) Field of Classification Search
CPC ........... H05K 1/113; H05K 2201/0305; H05K 2201/09481; H05K 2201/09545; H05K 2201/09563
See application file for complete search history.

(56) References Cited

U.S. PATENT DOCUMENTS 7,705,247 B2  4/2010  Kim et al.
9,491,867 B2 * 11/2016  Kurauchi ............... H05K 3/242
(Continued)

FOREIGN PATENT DOCUMENTS

JP  2007-27341 A   2/2007
JP  2009-295635 A  12/2009
(Continued)

OTHER PUBLICATIONS

International Search Report dated Sep. 21, 2021, issued in counterpart International Application No. PCT/JP2021/026731. (2 pages).

*Primary Examiner* — Hoa C Nguyen
(74) *Attorney, Agent, or Firm* — WHDA, LLP

(57) ABSTRACT

A wiring substrate includes a first insulating layer, a first conductor layer, and a plurality of filled vias. The first insulating layer has a first surface and a second surface positioned on a side opposite to the first surface. The first conductor layer is formed on the first surface of the first insulating layer. The plurality of filled vias are formed inside the first insulating layer. The plurality of filled vias each have a structure in which a via hole penetrating the first insulating layer is filled with a metal. The first conductor layer includes a pad. The pad overlaps the plurality of filled vias in a plan view from a thickness direction of the first insulating layer and is connected to the plurality of filled vias.

5 Claims, 2 Drawing Sheets

(52) U.S. Cl.
CPC ............ *H05K 2201/09545* (2013.01); *H05K 2201/09563* (2013.01)

(56) References Cited

U.S. PATENT DOCUMENTS

| | | | |
|---|---|---|---|
| 2014/0126156 A1* | 5/2014 | Naganuma | H05K 1/0233 361/720 |
| 2015/0021084 A1 | 1/2015 | Ko et al. | |
| 2015/0189751 A1* | 7/2015 | Akahoshi | H05K 3/4661 174/262 |
| 2020/0029431 A1* | 1/2020 | Hayashi | H05K 1/116 |

FOREIGN PATENT DOCUMENTS

| | | |
|---|---|---|
| JP | 2015-23288 A | 2/2015 |
| JP | 2016-051756 A | 4/2016 |
| JP | 2020-161767 A | 10/2020 |

\* cited by examiner

WIRING SUBSTRATE

TECHNICAL FIELD

The present invention relates to a wiring substrate.

Priority is claimed on Japanese Patent Application No. 2020-191768 filed on Nov. 18, 2020, the content of which is incorporated herein by reference.

BACKGROUND ART

Patent Literature 1 discloses a wiring substrate including a filled via and a pad. The filled via has a structure in which a via hole penetrating an insulating layer is filled with a metal. The pad is provided on the insulating layer to overlap the filled via.

CITATION LIST

Patent Literature

Patent Literature 1

Japanese Unexamined Patent Application, First Publication No. 2007-27341

SUMMARY OF INVENTION

Technical Problem

A coefficient of linear expansion differs between a metal forming the filled via and the pad and an insulator forming the insulating layer. Therefore, when a change in temperature occurs in the wiring substrate, the filled via or the like may be cracked due to a thermal stress, or a connection part between the filled via and the pad may be disconnected, and thereby reliability of electrical connection in the wiring substrate may decrease.

The present invention has been made in consideration of such circumstances, and an objective of the present invention is to provide a wiring substrate in which reliability of electrical connection can be improved.

Solution to Problem

In order to solve the above-described problems, a wiring substrate according to one aspect of the present invention includes a first insulating layer having a first surface and a second surface positioned on a side opposite to the first surface, a first conductor layer formed on the first surface of the first insulating layer, and a plurality of filled vias formed inside the first insulating layer, in which the plurality of filled vias each have a structure in which a via hole penetrating the first insulating layer is filled with a metal, and the first conductor layer includes a pad which overlaps the plurality of filled vias in a plan view from a thickness direction of the first insulating layer and is connected to the plurality of filled vias.

According to the above-described aspect, it is possible to disperse a thermal stress generated between the pad and the filled vias since the plurality of filled vias are connected to the pad. Thereby, even in a wiring substrate in which the first insulating layer greatly expands thermally such as when a thickness of the first insulating layer is large or when a coefficient of linear expansion of a material of the first insulating layer is large, it is possible to suppress occurrence of disconnection or the like. Therefore, it is possible to provide a wiring substrate in which reliability of electrical connection is improved.

Here, the wiring substrate of the above-described aspect may further include a second insulating layer laminated to face the second surface of the first insulating layer and having a third surface which faces the second surface of the first insulating layer and a fourth surface which is positioned on a side opposite to the third surface, and a second conductor layer formed on the fourth surface of the second insulating layer, in which the second insulating layer may have a through hole which overlaps the plurality of filled vias in the plan view, and a plated layer for electrically connecting the second conductor layer and the plurality of filled vias may be formed on an inner surface of the through hole.

Also, the pad may be formed in a substantially circular shape, a substantially elliptical shape, or a substantially rectangular shape in the plan view, and a solder bump may be in contact with the pad.

Advantageous Effects of Invention

According to the above-described aspect of the present invention, it is possible to provide a wiring substrate in which reliability of electrical connection is improved.

BRIEF DESCRIPTION OF DRAWINGS

FIG. 2 is a view from the arrow II of FIG. 1 and is a perspective view illustrating a filled via and the like.

DESCRIPTION OF EMBODIMENTS

Hereinafter, a wiring substrate of the present embodiment will be described on the basis of the drawings.

Figure 1:
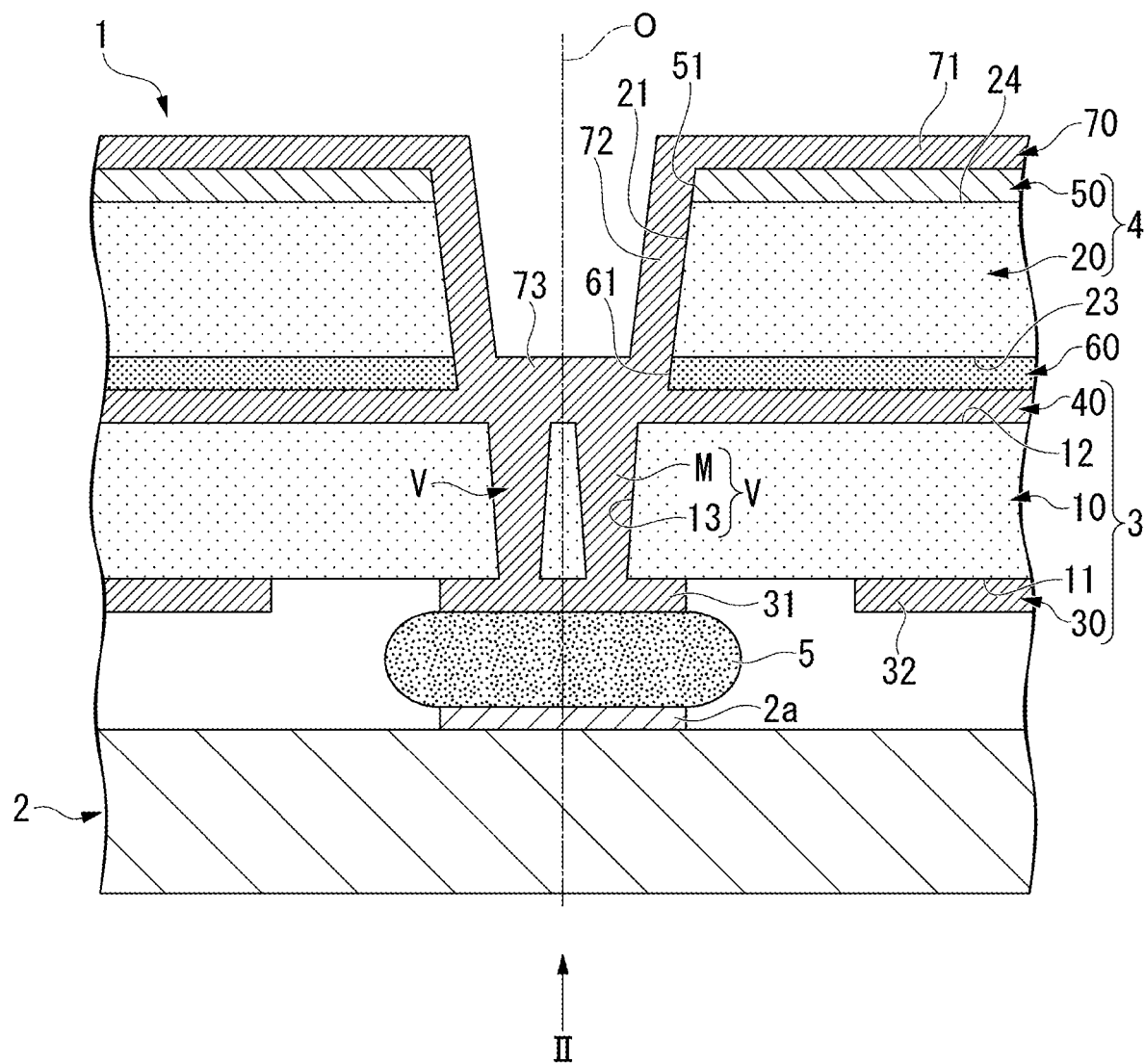
FIG. 1 is a longitudinal sectional view of a wiring substrate according to the present embodiment.

As illustrated in FIG. 1, the wiring substrate 1 includes a first insulating layer 10, a second insulating layer 20, a first conductor layer 30, an intermediate conductor layer 40, a second conductor layer 50, and an adhesive layer 60, and a plated layer 70. An electronic component 2 may be mounted on the wiring substrate 1 with a solder bump 5 interposed therebetween. In the example illustrated in FIG. 1, a pad 31 included in the first conductor layer 30 and a terminal 2a included in the electronic component 2 are connected by the solder bump 5.

Definition of Directions

Figure 2:
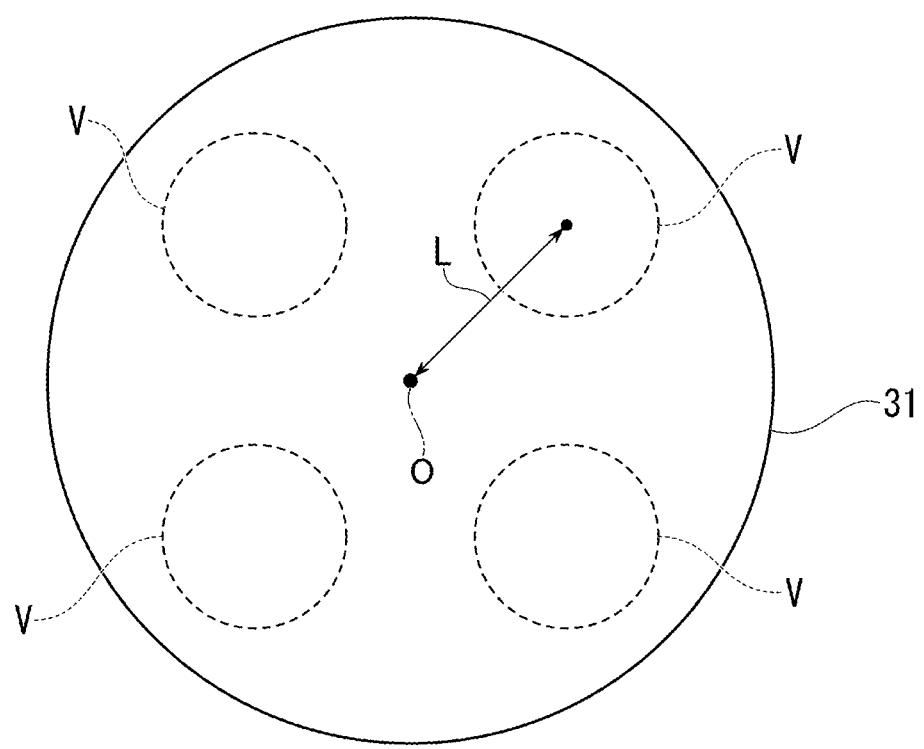

In the present embodiment, a thickness direction of the first insulating layer 10 is simply referred to as a "thickness direction." Also, a view from the thickness direction is referred to as a plan view. A cross-sectional view in the thickness direction is referred to as a longitudinal sectional view. FIG. 1 is a longitudinal sectional view of the wiring substrate 1 in a state in which the electronic component 2 is mounted. FIG. 2 is a plan view in which a part of FIG. 1 is extracted.

As illustrated in FIG. 1, the first insulating layer 10 has a first surface 11 and a second surface 12. The second surface 12 is positioned on a side opposite to the first surface 11. The first surface 11 faces the electronic component 2, and the second surface 12 faces the second insulating layer 20. The first conductor layer 30 is formed on the first surface 11, and the intermediate conductor layer 40 is formed on the second surface 12. The first insulating layer 10, the first conductor layer 30, and the intermediate conductor layer 40 constitute a double-sided copper clad laminated sheet 3. However, a material of the intermediate conductor layer 40 and the first conductor layer 30 may not be copper. Also, the first conductor layer 30 or the like may not be a part of the double-sided copper clad laminated sheet 3, and the intermediate conductor layer 40 may not be provided.

A plurality of filled vias V are formed inside the first insulating layer 10. The filled vias V each have a structure in which a via hole 13 penetrating the first insulating layer 10 in the thickness direction is filled with a metal M. The first conductor layer 30 (the pad 31) and the intermediate conductor layer 40 are electrically connected by the filled via V. As a material of the metal M, it is possible to employ a material arbitrarily selected from known materials, but copper is preferable. As a method of filling the inside of the via hole 13 with the metal M, a plating treatment is preferable. That is, it is possible to fill the via hole 13 with the metal M when the via hole 13 is formed in the first insulating layer 10 and then a plating treatment is performed on an inner circumferential surface of the via hole 13. When the inner circumferential surface of the via hole 13 is subjected to the plating treatment, the first surface 11 and the second surface 12 may also be subjected to the plating treatment. In this case, the first conductor layer 30 and the intermediate conductor layer 40 are formed when the filled via V is formed, and thus a material of the metal M, a material of the first conductor layer 30, and a material of the intermediate conductor layer 40 become the same.

When a plating process is employed, for example, an inner diameter of the via hole 13 may be about 40 μm. In this case, it is possible to suppress formation of a void (air gap) in the via holes 13, and it is possible to stably fill the via hole 13 with the metal M. Further, a thickness of the intermediate conductor layer 40 may be 12 μm or less. In this case, it becomes easy to form highly fine wiring, and it is possible to realize wiring with excellent high-frequency characteristics. Therefore, the thickness of the intermediate conductor layer 40 is more preferably 12 μm or less. As a method of forming the via hole 13 in the first insulating layer 10, it is possible to employ cutting work by a drill or the like or laser processing. Particularly, laser processing is suitable in that it is capable of forming the via hole 13 having an inner diameter of about 40 μm with high accuracy.

The pad 31 and a circuit 32 are included in the first conductor layer 30. It is possible to form the pad 31 and the circuit 32 by, for example, subjecting one surface of the double-sided copper clad laminated sheet 3 to etching processing or the like. The pad 31 may be connected to the circuit 32. The pad 31 may be used for mounting the electronic component 2 on the wiring substrate 1 or may be used for other purposes. As illustrated in FIG. 2, the pad 31 may be formed in a substantially circular shape in a plan view. However, a shape of the pad 31 may be changed as appropriate, and may be a substantially elliptical shape, a substantially rectangular shape, or the like. Further, "substantially circular shape," "substantially elliptical shape," and "substantially rectangular shape" also include cases in which they are capable of being regarded as a circular shape, an elliptical shape, and a rectangular shape, if manufacturing errors are removed.

As illustrated in FIG. 2, in the present embodiment, the pad 31 is disposed to overlap the four filled vias V in a plan view. Also, the four filled vias V are evenly disposed around a common axis O. More specifically, when a distance between a center of each of the filled vias V and the axis O is L in a plan view, the distances L of the four filled vias V are equivalent to each other. Also in a direction around the axis O (circumferential direction), the four filled vias V are disposed at substantially equal intervals. Further, "substantially equal intervals" also includes a case in which it is capable of being regarded as equal intervals if a manufacturing error is removed. As a result of a study by the inventors of the present application, it was found that reliability of electrical connection is satisfactory when the four filled vias V overlap the pad 31 in a plan view and the distance L is about 40 μm as illustrated in FIG. 2.

In the present embodiment, one pad 31 is illustrated, but a plurality of pads 31 may be used. The plurality of pads 31 are independent from each other. For example, the plurality of pads 31 are respectively connected to a plurality of terminals 2a included in the electronic component 2 by a plurality of solder bumps 5. The plurality of pads 31 may be respectively disposed to overlap the plurality of (four in the present embodiment) filled vias V in a plan view. Also, in a plan view, an area of the pad 31 and an area of the solder bump 5 are approximately equal (in FIG. 1, the solder bump 5 is slightly larger than the pad 31).

As illustrated in FIG. 1, the second insulating layer 20 has a third surface 23 and a fourth surface 24. The second insulating layer 20 is laminated to face the second surface 12 of the first insulating layer 10. The fourth surface 24 is positioned on a side opposite to the third surface 23. The third surface 23 faces the second surface 12 of the first insulating layer 10, and the fourth surface 24 faces the second conductor layer 50. The third surface 23 is adhered to and fixed to the intermediate conductor layer 40 with the adhesive layer 60 interposed therebetween. As a material of the adhesive layer 60, it is possible to employ an adhesive arbitrarily selected from known adhesives. The second conductor layer 50 is formed on the fourth surface 24. The second insulating layer 20 and the second conductor layer 50 constitute a single-sided copper clad laminated sheet 4. That is, the wiring substrate 1 of the present embodiment has a structure in which the single-sided copper clad laminated sheet 4 is laminated on the double-sided copper clad laminated sheet 3 with the adhesive layer 60 interposed therebetween. However, a material of the second conductor layer 50 may not be copper. Also, the second insulating layer 20 or the like may not be a part of the single-sided copper clad laminated sheet 4.

A through hole 21 that penetrates the second insulating layer 20 in the thickness direction is formed in the second insulating layer 20. Although not illustrated, the through hole 21 is disposed to overlap the four filled vias V (see FIG. 2) in a plan view. Similar through holes 61 and 51 are also formed in the adhesive layer 60 and the second conductor layer 50. It is possible to form these through holes 21, 51, and 61 by subjecting the single-sided copper clad laminated sheet 4 to cutting work, laser processing, or the like. Inner diameters of the through holes 21, 51, and 61 are, for example, about 200 μm, and this is larger than the inner diameter of the via hole 13.

A sum of areas of the filled vias V in a plan view from the thickness direction of the first insulating layer 10 may be greater than one eighth of an area of the through holes 21, 51, and 61 in a plan view from the thickness direction of the second insulating layer 20. In this case, it is possible to make the reliability of the electrical connection more satisfactory. Also, the diameter of the filled via V may be larger than one sixth of the diameter of the through holes 21, 51, and 61. Also in this case, it is possible to make the reliability of the electrical connection more satisfactory.

The plated layer 70 has a flat surface part 71, an inner surface part 72, and a bottom surface part 73. The flat surface part 71 is formed on the second conductor layer 50. The inner surface part 72 is formed on inner circumferential surfaces of the through holes 21, 51, and 61. The bottom surface part 73 is formed on the intermediate conductor layer 40. The flat surface part 71, the inner surface part 72, and the bottom surface part 73 may be formed by the same plating process. In this case, thicknesses of the parts 71 to 73 are substantially the same. Further, "substantially the same" also includes a case in which they are capable of being regarded as the same if a manufacturing error is removed. A shape of the inner surface part 72 is cylindrical, and the inside of the inner surface part 72 is hollow. The bottom surface part 73 is electrically connected to the plurality of filled vias V via the intermediate conductor layer 40. The bottom surface part 73 may be directly connected to upper ends of the plurality of filled vias V without interposing the intermediate conductor layer 40.

As described above, the wiring substrate 1 of the present embodiment includes the first insulating layer 10 having the first surface 11 and the second surface 12 positioned on a side opposite to the first surface 11, the first conductor layer 30 formed on a surface (the first surface 11) of the first insulating layer 10, and the plurality of filled vias V formed inside the first insulating layer 10, in which the plurality of filled vias V each have a structure in which the via hole 13 penetrating the first insulating layer 10 is filled with the metal M, and the first conductor layer 30 includes the pad 31 that overlaps the plurality of filled vias V in a plan view from the thickness direction of the first insulating layer 10 and is connected to the plurality of filled vias V.

According to such a configuration, it is possible to disperse a thermal stress generated between the pad 31 and the filled vias V since the plurality of filled vias V are connected to the pad 31. Thereby, even in the wiring substrate 1 in which the first insulating layer 10 greatly expands thermally such as when a thickness of the first insulating layer 10 is large or when a coefficient of linear expansion of the material of the first insulating layer 10 is large, it is possible to suppress occurrence of disconnection or the like. Therefore, it is possible to provide the wiring substrate 1 in which reliability of electrical connection is improved.

Also, the wiring substrate 1 of the present embodiment further includes the second insulating layer 20 laminated to face the second surface 12 of the first insulating layer 10 and having the third surface 23 that faces the second surface 12 of the first insulating layer 10 and the fourth surface 24 that is positioned on a side opposite to the third surface 23, and the second conductor layer 50 formed on the fourth surface 24 of the second insulating layer 20, in which the second insulating layer 20 has the through hole 21 that overlaps the plurality of filled vias V in a plan view, and the plated layer 70 (the inner surface part 72) for electrically connecting the second conductor layer 50 and the plurality of filled vias V is formed on an inner surface of the through hole 21. Thereby, for example, when the second conductor layer 50 itself has a circuit pattern or when the second conductor layer 50 is connected to another circuit pattern, it is possible to electrically connect the circuit pattern and the pad 31 by a short path. Also, since reliability of the electrical connection between the pad 31 and the filled vias V is high as described above, it is possible to reduce a transmission loss more effectively.

Also, the pad 31 is formed in a substantially circular shape, a substantially elliptical shape, or a substantially rectangular shape in a plan view, and the solder bump 5 is in contact with the pad 31. Thereby, it is possible to mount the electronic component 2 on the wiring substrate 1 with the solder bump 5 interposed therebetween. As described above, the wiring substrate 1 of the present embodiment has high reliability of electrical connection, and a connection path from the pad 31 to the second conductor layer 50 is short. Therefore, when the electronic component 2 is, for example, a component that processes a high-frequency signal, it is possible to effectively minimize attenuation of the high-frequency signal.

Next, an example of a manufacturing method of the wiring substrate 1 as described above will be described. Further, the following manufacturing method is merely an example, and the wiring substrate 1 may be manufactured by other methods.

First, the double-sided copper clad laminated sheet 3 and the single-sided copper clad laminated sheet 4 are prepared.

Next, the plurality of via holes 13 are formed in the double-sided copper clad laminated sheet 3 by performing laser processing or the like on the double-sided copper clad laminated sheet 3.

Next, the via holes 13 are each filled with the metal M (copper) by subjecting the inside of the via hole 13 to a plating treatment. Thereby, the double-sided copper clad laminated sheet 3 in which the plurality of filled vias V are formed is obtained.

Next, the single-sided copper clad laminated sheet 4 is laminated on the double-sided copper clad laminated sheet 3 with the adhesive layer 60 interposed therebetween.

Next, the through holes 21, 51, and 61 are formed in the single-sided copper clad laminated sheet 4 by performing laser processing or the like on the single-sided copper clad laminated sheet 4.

Next, the plated layer 70 is formed by subjecting the single-sided copper clad laminated sheet 4 to a plating treatment. Thereby, the flat surface part 71, the inner surface part 72, and the bottom surface part 73 of the plated layer 70 are formed, and the intermediate conductor layer 40 and the second conductor layer 50 are electrically connected. Also, since the first conductor layer 30 (the pad 31) and the intermediate conductor layer 40 are electrically connected via the filled vias V, the second conductor layer 50 and the first conductor layer 30 are also electrically connected.

In the above-described manufacturing method, a circuit pattern may be formed on the intermediate conductor layer 40, the second conductor layer 50, the flat surface part 71 of the plated layer 70, and the like at any timing. Formation of the circuit pattern may be performed by etching processing.

In a conventional manufacturing method, generally, the filled via V is formed, for example, by filling the via hole 13 with a conductive paste. In this conventional manufacturing method, the conductive paste protruded from the via hole 13 is required to be polished for smoothing. On the other hand, in the manufacturing method of the present embodiment, the filled via V is formed by subjecting the inside of the via hole 13 to a plating treatment. Therefore, the conductive paste is not used, and thus it is possible to reduce the material costs. Further, it is possible to achieve cost reduction in that the step of polishing the protruded conductive paste is not required. Also, as described above, an inner diameter of the via hole 13 is made small (for example, about 40 μm), and thereby it is possible to suppress formation of voids in the via hole 13 and it is possible to stably fill the metal M therein.

The technical scope of the present invention is not limited to the above-described embodiment, and it is possible to make various modifications in a range not departing from the meaning of the present invention.

For example, the wiring substrate 1 of the above-described embodiment is a multilayer wiring substrate including the two insulating layers 10 and 20, but the second insulating layer 20 may not be provided. That is, the wiring substrate 1 may have a single-layer structure.

Also, the electronic component 2 is mounted on the wiring substrate 1 of the above-described embodiment, but the electronic component 2 may not be mounted.

Also, in the above-described embodiment, the four filled vias V have been disposed to overlap the pad 31 in a plan view. However, it is possible to change the number of filled vias V as appropriate. The number of filled vias V overlapping the pad 31 in a plan view may be two or more. In this case, it is possible to disperse a thermal stress more than that in conventional cases, and it is possible to improve reliability of the electrical connection.

In addition, it is possible to appropriately replace the components in the above-described embodiments with well-known components within a range not departing from the meaning of the present invention, and the embodiments and modified examples described above may be appropriately combined.

REFERENCE SIGNS LIST

1 Wiring substrate
5 Solder bump
10 First insulating layer
11 First surface
12 Second surface
13 Via hole
20 Second insulating layer
21 Through hole
23 Third surface
24 Fourth surface
30 First conductor layer
31 Pad
50 Second conductor layer
70 Plated layer
M Metal
V Filled via

The invention claimed is:

1. A wiring substrate comprising:
a first insulating layer having a first surface and a second surface positioned on a side opposite to the first surface;
a first conductor layer formed on the first surface of the first insulating layer;
a plurality of filled vias formed inside the first insulating layer,
a second insulating layer laminated to face the second surface of the first insulating layer and having a third surface which faces the second surface of the first insulating layer and a fourth surface which is positioned on a side opposite to the third surface; and
a second conductor layer formed on the fourth surface of the second insulating layer, wherein
the plurality of filled vias each have a structure in which a via hole penetrating the first insulating layer is filled with a metal,
the first conductor layer includes a pad which overlaps the plurality of filled vias in a plan view from a thickness direction of the first insulating layer and is connected to the plurality of filled vias,
the second insulating layer has a through hole which overlaps the plurality of filled vias in the plan view,
a plated layer for electrically connecting the second conductor layer and the plurality of filled vias is formed on an inner surface of the through hole,
the plated layer has an inner surface part formed on inner circumferential surfaces of the through hole,
a shape of the inner surface part is cylindrical, and
an inside of the inner surface part is hollow.

2. The wiring substrate according to claim 1, wherein
the pad is formed in a substantially circular shape, a substantially elliptical shape, or a substantially rectangular shape in the plan view, and
a solder bump is in contact with the pad.

3. The wiring substrate according to claim 1, wherein
a sum of areas of the filled vias in the plan view is greater than one eighth of an area of the through hole in the plan view.

4. The wiring substrate according to claim 1, wherein
a diameter of the filled via is larger than one sixth of a diameter of the through hole.

5. The wiring substrate according to claim 1, further comprising
an intermediate conductor layer formed on the second surface, wherein
the plated layer has a flat surface part formed on the second conductor layer and a bottom surface part formed on the intermediate conductor layer, and
the pad, the plurality of filled vias, the flat surface part, the inner surface part, the bottom surface part and the intermediate conductor layer form an integral structure.

* * * * *